United States Patent
Park (10) Patent No.: US 10,867,644 B2
(45) Date of Patent: Dec. 15, 2020

(54) MEMORY SYSTEM AND OPERATING METHOD THEREOF

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 412 days.

(21) Appl. No.: 15/977,827

(22) Filed: May 11, 2018

(65) Prior Publication Data

US 2019/0103144 A1 Apr. 4, 2019

(30) Foreign Application Priority Data

Sep. 29, 2017 (KR) .................. 10-2017-0127241

(51) Int. Cl.
*G06F 12/00* (2006.01)
*G11C 7/10* (2006.01)
*G06F 13/16* (2006.01)

(52) U.S. Cl.
CPC .......... *G11C 7/1078* (2013.01); *G06F 13/161* (2013.01)

(58) Field of Classification Search
CPC .. G06F 3/0656; G06F 16/2471; G06F 3/0659; G06F 3/061; G06F 17/2705; G06F 13/1673; G06F 3/0631; G06F 11/3409; G06F 2209/5022
See application file for complete search history.

(56) References Cited

U.S. PATENT DOCUMENTS

2013/0205091 A1 * 8/2013 Liang .................. G06F 12/0846
711/130
2016/0266804 A1 * 9/2016 Shimizu ................ G06F 13/161

FOREIGN PATENT DOCUMENTS

KR 1020160066362 6/2016

* cited by examiner

*Primary Examiner* — Sean D Rossiter
(74) *Attorney, Agent, or Firm* — IP & T Group LLP (57) ABSTRACT

A memory system includes a plurality of nonvolatile memory devices sharing a communication line; and a controller including a buffer and a core, and suitable for controlling the nonvolatile memory devices through the communication line, wherein the core determines a type of a plurality of read requests for the nonvolatile memory devices, and sets a usable size of the buffer depending on the type.

19 Claims, 9 Drawing Sheets

MEMORY SYSTEM AND OPERATING METHOD THEREOF

CROSS-REFERENCE TO RELATED APPLICATION

The present application claims priority under 35 U.S.C. § 119(a) to Korean application number 10-2017-0127241, filed on Sep. 29, 2017, in the Korean Intellectual Property Office, which is incorporated herein by reference in its entirety.

BACKGROUND

1. Technical Field

Various exemplary embodiments of the present disclosure generally relate to a memory system. Particularly, the embodiments relate to a memory system including a nonvolatile memory device.

2. Related Art

Memory systems may store data provided by an external device in response to a write request. Memory systems may also provide stored data to an external device in response to a read request. Examples of external devices that use memory systems include computers, digital cameras, cellular phones, and the like. Memory systems may be embedded in an external device during manufacturing of the external devices or may be fabricated separately and then connected afterwards to an external device.

SUMMARY

In an embodiment, a memory system may include: a plurality of nonvolatile memory devices sharing a communication line; and a controller including a buffer and a core, and suitable for controlling the nonvolatile memory devices through the communication line, wherein the core determines a type of a plurality of read requests for the nonvolatile memory devices, and sets a usable size of the buffer depending on the type.

In an embodiment, a method for operating a memory system may include: determining a type of a plurality of read requests for a plurality of nonvolatile memory devices; and setting a usable size of a buffer depending on the type.

In an embodiment, a method for operating a memory system may include: adjusting a usable size of a buffer; requesting allocation of clusters for each of a plurality of read requests; allocating the clusters based on a free size of the buffer calculated based on the usable size; and processing a read request for which the clusters are allocated.

In an embodiment, a memory system may include: a plurality of memory devices; a buffer suitable for buffering data to be provided to a host, the buffer having a flexible size; and a controller suitable for: controlling each of the plurality of memory devices to provide read data to the buffer in response to a read request, adjusting, in response to a plurality of in-order read requests, the size of the buffer, the size of the buffer being adjusted to accommodate a subset of the plurality of in-order read requests, and allocating the buffer for the subset of in-order read requests in order.

DETAILED DESCRIPTION

A memory system and an operating method thereof according to embodiments of the present invention will be described with reference to the accompanying drawings. The present invention may, however, be embodied in different forms and should not be construed as being limited to the embodiments set forth herein. Rather, these embodiments are provided to describe the present invention in detail to the extent that a person skilled in the art to which the invention pertains can practice the technical concepts of the present invention. Moreover, reference to "an embodiment" does not necessarily mean only one embodiment, and different references to "an embodiment" are necessarily to the same embodiment(s).

It is to be understood that embodiments of the present invention are not limited to the particulars shown in the drawings. The drawings are not necessarily to scale, and, in some instances, proportions may have been exaggerated in order to more clearly depict certain features of the invention. While particular terminology has been used, it is to be understood that the terminology used is for describing one or more particular embodiments only and is not intended to limit the scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The phrase "at least one of . . . and . . . ," when used herein with a list of items, means a single item from the list or any combination of items in the list. For example, "at least one of A, B, and C" means only A, or only B, or only C, or any combination of A, B, and C.

As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as will be apparent to those skilled in the relevant art, an element or feature described in connection with one embodiment may be used singly or in combination with other elements or features of another embodiment, unless specifically indicated otherwise.

Various embodiments of the present invention will be described in detail with reference to the attached drawings.

Figure 1:
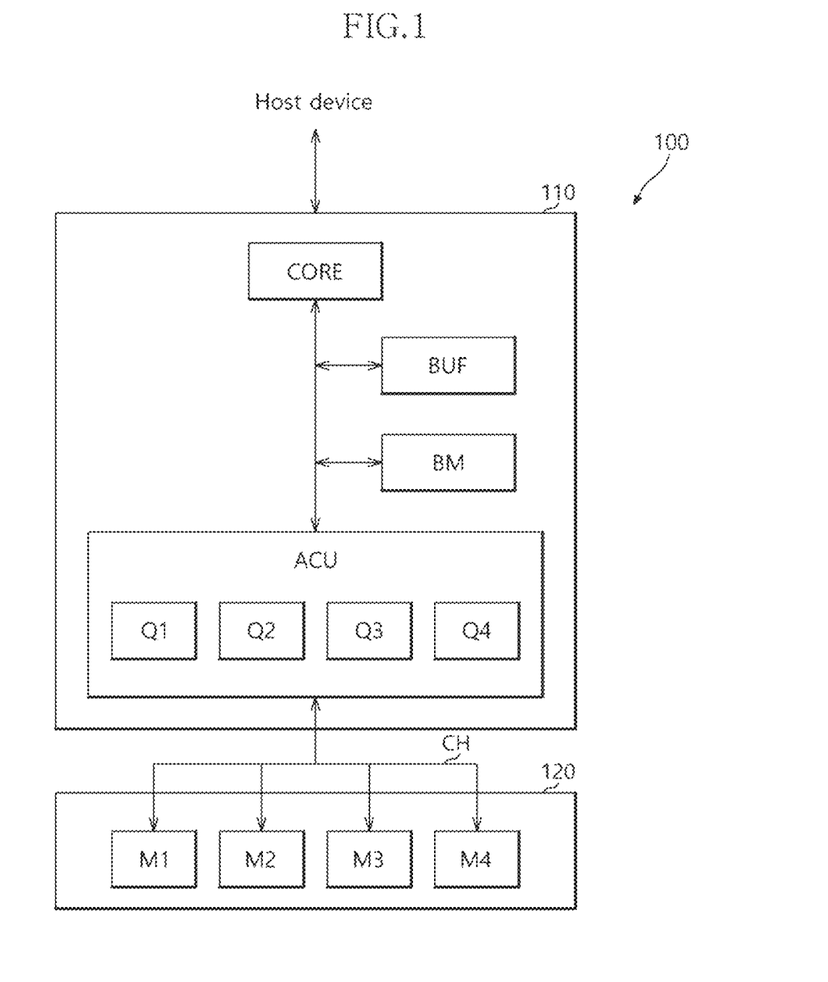
FIG. 1 is a block diagram illustrating a memory system in accordance with an embodiment.

FIG. 1 is a block diagram illustrating a memory system 100 in accordance with an embodiment.

The memory system 100 may store data provided from a host device, in response to a write request from the host device. Also, the memory system 100 may provide stored data to the host device, in response to a read request from the host device.

The memory system 100 may be configured by a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD), and the like.

The memory system 100 may include a controller 110 and a storage medium 120. The storage medium 120 may include first to fourth nonvolatile memory devices M1 to M4.

The controller 110 may store data in the storage medium 120 by controlling the storage medium 120. The controller 110 may include a core CORE, a buffer BUF, a buffer manager BM and an access unit ACU. The ACU may be realized as a hardware component, such as an integrated circuit or application specific integrated circuit (ASIC), or as a combination of hardware and software components, such as a processor configured to executed programmed instructions.

The core CORE may control general operations of the controller 110. When receiving a read request from the host device, the core CORE may request the buffer manager BM to allocate clusters of the buffer BUF. The clusters may store the data read from the storage medium 120 according to the read request, until it is transmitted to the host device. When clusters for the read request are allocated, the core CORE may instruct the access unit ACU to process the read request.

When receiving a plurality of read requests from the host device, the core CORE may determine the type of the read requests. In detail, the core CORE may determine whether the type of the read requests is in-order or out-of-order. When the read requests are "in-order" read requests, an order of which is arranged, the data that are read respectively in response to the in-order read requests should be transmitted to the host device according to the order of the in-order read requests. When the read requests are "out-of-order" read requests, an order of which are not arranged, the data that are read respectively in response to the out-of-order read requests may be transmitted in order in which the data are read from the storage medium 120.

When the type of read requests is in-order, the core CORE may set an allowed size of the buffer BUF. In detail, the core CORE may set the allowed size to two times the maximum data size capable of being transmitted to the buffer BUF through a single read operation of a nonvolatile memory device in the storage medium 120. Such maximum data size may be two times the amount of data to be provided to buffer BUF through a single read operation of a nonvolatile memory device. For example, the allowed size of the buffer BUF may be set to store data to be processed in response to two read requests for two nonvolatile memory devices in the storage medium 120. The allowed size of the buffer BUF may allow the first to fourth nonvolatile memory devices M1 to M4 to perform operations while keeping the order of the in-order read requests, as will be described later.

The size of the buffer BUF may be predetermined. The predetermined size may be, for example, a size required for read requests for first to fourth nonvolatile memory devices M1 to M4 in the storage medium 120. According to an embodiment, the core CORE may set in advance the predetermined size of the buffer BUF to evenly use the clusters of the buffer BUF for a plurality of channels. When the type of read requests is in-order, the core CORE may adjust the predetermined size to the allowed size, which is two times the maximum data size capable of being transmitted to the buffer BUF through a single read operation of one or the nonvolatile memory devices M1 to M4.

However, when the type of read requests is out-of-order, the core CORE may not adjust the size of the buffer BUF. If the size of the buffer BUF is already set to the predetermined size, the core CORE may retain the such size.

Further, when the type of read requests is in-order, after setting the allowed size of the buffer BUF, the core CORE may request the buffer manager BM to allocate clusters for a selected read request among the read requests according to the order of the in-order read requests. After clusters are allocated for the selected read request, the core CORE may instruct the access unit ACU to process the selected read request.

The buffer BUF may include a plurality of clusters. The clusters may temporarily store data to be transmitted between the host device and the storage medium 120. Each of the clusters may store a predetermined size of data. For example, each of the clusters may store 4 k bytes of data, but embodiments are not limited thereto.

The buffer manager BM may manage allocation and deallocation of the clusters of the buffer BUF. In detail, the buffer manager BM may allocate the clusters of the buffer BUF to a read request according to a request of the core CORE. If the data read from the storage medium 120 is transmitted to clusters and is transmitted from the clusters to the host device according to the read request, the buffer manager BM may deallocate the clusters allocated to the read request.

The buffer manager BM may set an allowed size of the buffer BUF according to control of the core CORE, and may allocate clusters based on the set allowed size when the core CORE requests allocation of clusters.

The allowed size of the buffer BUF may be the maximum size for a channel CH. That is, the allowed size of the buffer BUF may be associated with the channel CH. For example, when the storage medium 120 includes more nonvolatile memory devices (e.g., M5 to Mn not shown) coupled to another channel (not shown), the buffer manager BM may allocate clusters for a read request for this other channel, regardless of the allowed size set for the channel CH coupled to the first to fourth nonvolatile memory devices M1 to M4.

The buffer manager BM may allocate clusters for a read request when the difference between the allowed size of the buffer BUF for the channel CH and a currently allocated size is greater than or equal to the required size for the read request. The clusters may be allocated for the read request as required for the read request. The currently allocated size of the buffer BUF may mean the size of clusters currently allocated for the channel CH. The required size for a read request may mean the size of clusters of the buffer BUF necessary for performing a read operation in response to the read request. The difference between the allowed size and the currently allocated size may be referred to as an unused size (that is, a free size) of the current buffer BUF below.

The access unit ACU may process a read request according to the instruction of the core CORE. Processing of a read request may be a series of processes including queueing the read request into a queue, transmitting a read command corresponding to the queued read request to a nonvolatile memory device of the storage medium 120, and storing in the clusters allocated for the read request the data transmitted from the nonvolatile memory device in response to the read command.

The access unit ACU may include first to fourth queues Q1 to Q4. The first to fourth queues Q1 to Q4 may correspond to the first to fourth nonvolatile memory devices M1 to M4, respectively. Each of the first to fourth queues Q1 to Q4 may queue read requests to be processed for the corresponding one of the first to fourth nonvolatile memory devices M1 to M4. The read requests queued into Q1 to Q4 may start to be processed substantially out of order depending on the states of M1 to M4 and the state of the channel CH.

According to an embodiment, by setting the allowed size of the buffer BUF, in-order read requests may be processed in order thereof. An operation method according to an embodiment will be described later in detail.

The storage medium 120 may store data and may read stored data and transmit read data to the access unit ACU, according to control of the access unit ACU.

The first to fourth nonvolatile memory devices M1 to M4 in the storage medium 120 may share the channel CH which is coupled with the access unit ACU. The channel CH may include a read command transmission line and a data transmission line.

The first to fourth nonvolatile memory devices M1 to M4 may be controlled by the access unit ACU by being individually selected through separate select lines (not shown) by the access unit ACU. Each of M1 to M4 may receive a read command from the access unit ACU through the channel CH and output data in response to the read command.

A nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

In the illustrated embodiment of FIG. 1 the storage medium 120 includes the four first to fourth nonvolatile memory devices M1 to M4 coupled to the one channel CH. However, it is noted that the number of channels included in the storage medium 120 and the number of nonvolatile memory devices coupled to each channel are not limited to that arrangement.

Figure 2:
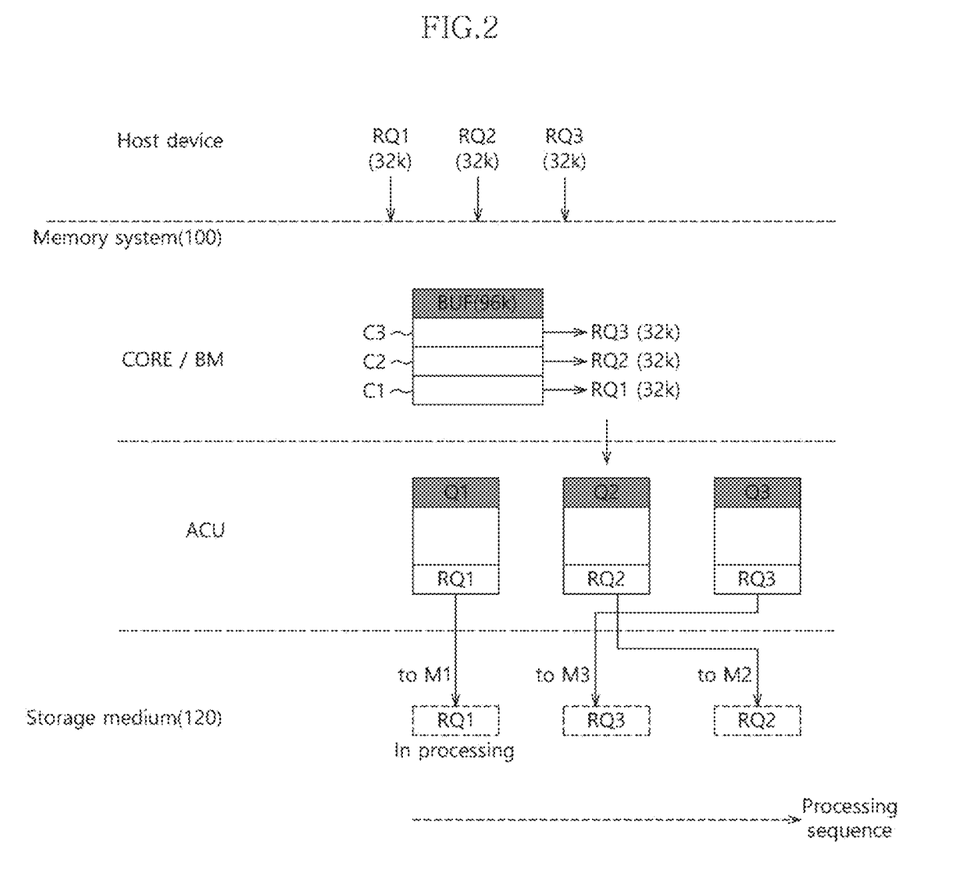
FIG. 2 is a diagram explaining a method of processing first to third read requests according to an embodiment.

FIG. 2 is a diagram explaining a method of processing first to third read requests RQ1 to RQ3 according to the embodiment.

In the following, it is assumed that, as an example, maximum 32 k bytes of data may be read from one nonvolatile memory device through a single read operation in response to a single read request. Also, it is assumed that, as an example, the first to third read requests RQ1 to RQ3 are to read 32 k bytes of data from the first to third nonvolatile memory devices M1 to M3, respectively.

Referring to FIG. 2, the host device may transmit the first to third read requests RQ1 to RQ3 to the memory system 100.

The core CORE may request the buffer manager BM to allocate dusters for the first to third read requests RQ1 to RQ3. It is assumed that the allowed size of the buffer BUF for the channel CH is set to, for example, 96 k bytes. According to an embodiment, the allowed size of the buffer BUF may have not been set.

The buffer BUF may include clusters C1 to C3. Each of the clusters C1 to C3 may store 32 k bytes of data. The unused size (in other words, the free size) of the current buffer BUF for the channel CH may be 96 k bytes. Thus, no clusters may be currently allocated to the channel CH. That is, the currently unused size may be sufficient to process the first to third read requests RQ1 to RQ3. Therefore, the clusters C1 to C3 may be allocated to the first to third read requests RQ1 to RQ3, respectively, through the buffer manager BM. After the clusters C1 to C3 are allocated, the core CORE may instruct the access unit ACU to process the read requests RQ1 to RQ3.

The access unit ACU may queue the first to third read requests RQ1 to RQ3 into the first to third queues Q1 to Q3 according to control of the core CORE. The first to third read requests RQ1 to RQ3 queued into the first to third queues Q1 to Q3 may start to be processed out of order depending on the states of the first to third nonvolatile memory devices M1 to M3 and the state of the channel CH. In other words, an order in which the read requests RQ1 to RQ3 are actually processed may not correspond to an order in which they are queued into the queues Q1 to Q3.

For example, when the first nonvolatile memory device M1 first enters an idle state and the channel CH is currently not occupied by any nonvolatile memory device, a read command corresponding to the first read request RQ1 may be first transmitted to the first nonvolatile memory device M1. Then, when the third nonvolatile memory device M3 enters an idle state and the channel CH is currently not occupied by any nonvolatile memory device, a read command corresponding to the third read request RQ3 may be transmitted to the third nonvolatile memory device M3. Thereafter, when the second nonvolatile memory device M2 enters an idle state and the channel CH is currently not occupied by any nonvolatile memory device, a read command corresponding to the second read request RQ2 may be transmitted to the second nonvolatile memory device M2.

The first to third nonvolatile memory devices M1 to M3 may perform read operations in a partially parallel manner in response to read commands. However, since the first to third nonvolatile memory devices M1 to M3 share the channel CH, they may output data in the order in which they receive the read commands. Namely, the first nonvolatile memory device M1, the third nonvolatile memory device M3 and the second nonvolatile memory device M2 may sequentially output data.

If the first to third read requests RQ1 to RQ3 are out-of-order read requests, the data read from the first to third nonvolatile memory devices M1 to M3 may be transmitted to the host device in the order in which the read data are transmitted to the clusters C1 to C3 of the buffer BUF.

If the first to third read requests RQ1 to RQ3 are in-order read requests, which are ordered from the first read request RQ1 to the third read request RQ3, in the case where RQ1, RQ3, and RQ2 are processed in that order, as described with reference to FIG. 2, operation performance may deteriorate.

In detail, for example, the first to third read requests RQ1 to RQ3 may be in-order read requests which should be processed by the first to third nonvolatile memory devices M1 to M3, respectively. In other words, the data read from the first to third nonvolatile memory devices M1 to M3 in response to the first to third read requests RQ1 to RQ3 should be transmitted to the host device according to the order of the first to third read requests RQ1 to RQ3 when RQ1 to RQ3 are in-order read requests.

Therefore, when the first to third read requests RQ1 to RQ3 are in-order read requests, even though the third read request RQ3 is processed prior to the second read request RQ2 as described with reference to FIG. 2, the data read in response to RQ3 may not be transmitted to the host device and may remain stored in the clusters C3 until data read in response to RQ2 is provided to the host. Further, although the second read request RQ2 has to be processed prior to the third read request RQ3, when the first to third read requests RQ1 to RQ3 are the in-order read requests, once the second read request RQ2 is inputted to the second queue Q2, RQ2 may not be processed prior to the third read request RQ3 depending on the state of the second nonvolatile memory device M2 and the state of the channel CH, as described with reference to FIG. 2. As a result, because the data read in response to the second read request RQ2 is transmitted later to the clusters C2 and is transmitted also later to the host device, the read performance of the memory system 100 may deteriorate.

Figure 3A:
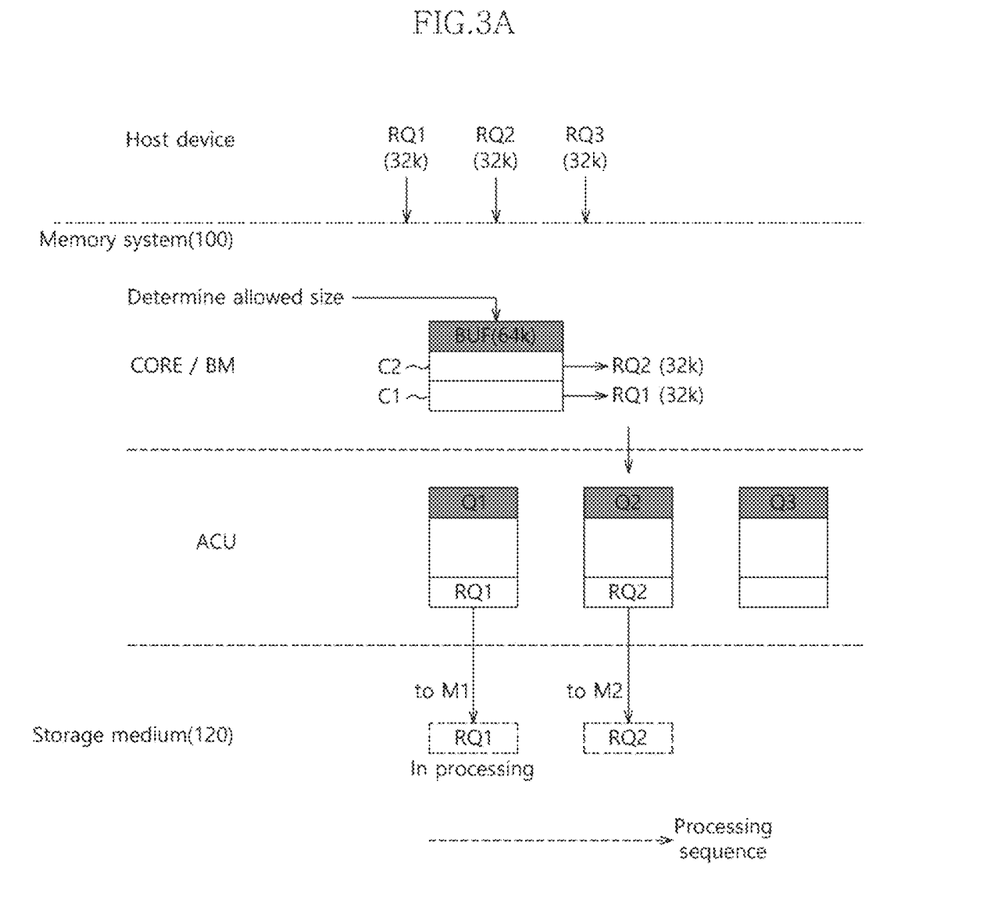
FIGS. 3A and 3B are diagrams explaining a method of processing in-order read requests by setting the usable size of a buffer according to an embodiment.
Figure 3B:
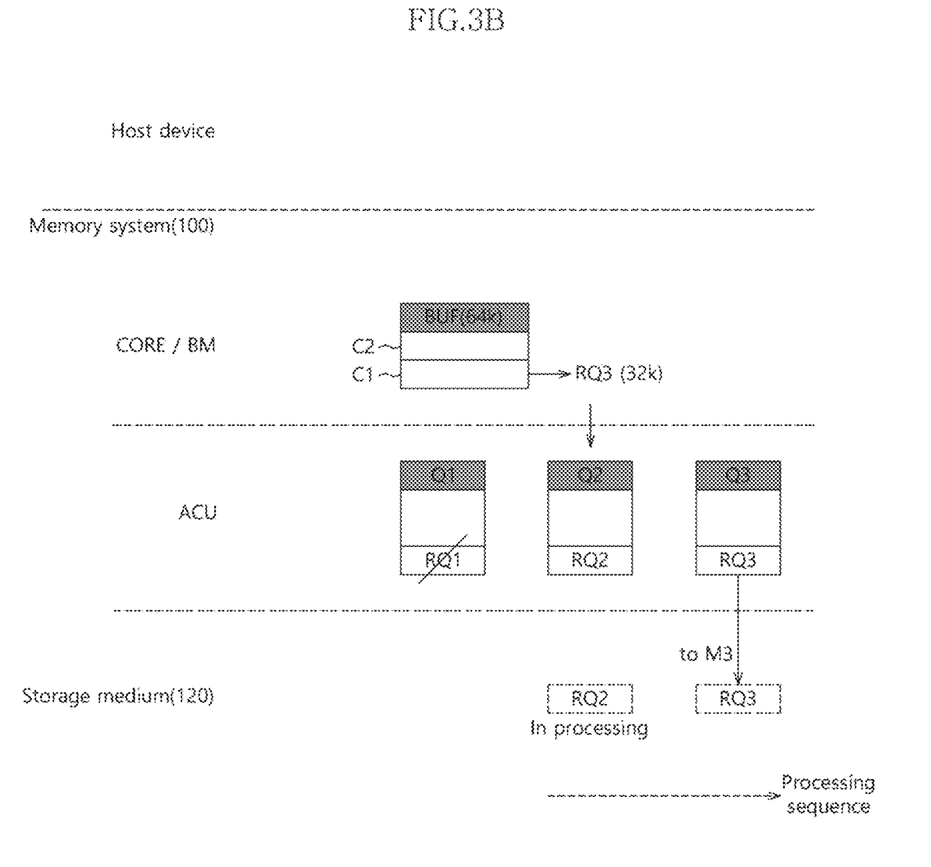

FIGS. 3A and 3B are diagrams explaining a method of processing in-order read requests RQ1 to RQ3 by setting the allowed size of the buffer BUF according to the embodiment.

In FIGS. 3A and 3B, it is assumed that first to third read requests RQ1 to RQ3 are in-order read requests which are ordered from the first read request RQ1 to the third read request RQ3.

Referring to FIG. 3A, the host device may transmit the first to third read requests RQ1 to RQ3 to the memory system 100.

The core CORE may determine that the type of the first to third read requests RQ1 to RQ3 are in-order. Since RQ1 to RQ3 are to be processed for the channel CH, the core CORE may set the allowed size of the buffer BUF for the channel CH.

As described above, the allowed size of the buffer BUF may be set to, for example, two times the maximum data size capable of being transmitted to the buffer BUF through a single read operation of a nonvolatile memory device. Therefore, when, for example, maximum 32 k bytes of data may be read from one nonvolatile memory device, the allowed size may be set to 64 k bytes. In this case, since read operations for two nonvolatile memory devices may be processed in such a way as to continuously overlap and thus the first to third read requests RQ1 to RQ3 may be processed in the order thereof, as described in detail below.

The buffer manager BM may adjust the size of the buffer BUF to the allowed size (e.g., 64 k bytes) for the channel CH according to control of the core CORE.

The unused size of the current buffer BUF for the channel CH may be 64 k bytes. Namely, no clusters may be currently allocated for the channel CH. That is, the currently unused size may be sufficient to process the first and second read requests RQ1 and RQ2. Therefore, the clusters C1 and C2 may be allocated for the first and second read requests RQ1 and RQ2, respectively, through the buffer manager BM. After the clusters C1 and C2 are allocated, the core CORE may instruct the access unit ACU to process the first and second read requests RQ1 and RQ2.

At this time, even if the core CORE requests the buffer manager BM to allocate clusters for the third read request RQ3, clusters for the third read request RQ3 may not be allocated due to the allowed size for the channel CH. In other words, since the clusters C1 and C2 are already allocated for the allowed size for the read requests RQ1 and RQ2, the currently unused size is 0 bytes and thus clusters for the third read request RQ3 may not be allocated. Therefore, the core CORE may not transmit the third read request RQ3 to the access unit ACU. That is, this scheme may hold the process for the third read request RQ3.

The access unit ACU may queue the first and second read requests RQ1 and RQ2 into the first and second queues Q1 and Q2 according to control of the core CORE. RQ1 and RQ2 queued into the first and second queues Q1 and Q2 may start to be processed depending on the states of the first and second nonvolatile memory devices M1 and M2 and the state of the channel CH.

For example, the first and second read requests RQ1 and RQ2 may be processed sequentially by the first and second nonvolatile memory devices M1 and M2. Namely, when the first nonvolatile memory device M1 enters an idle state and the channel CH is currently not occupied by any nonvolatile memory device, a read command corresponding to the first read request RQ1 may be first transmitted to the first nonvolatile memory device M1. As a result, the first read request RQ1 may be first processed. That is to say, the data read from the first nonvolatile memory device M1 in response to the first read request RQ1 may be transmitted to the clusters C1 and may then be transmitted to the host device according to the order.

The first and second nonvolatile memory devices M1 and M2 may perform read operations in a partially parallel manner in response to read commands. However, since the first and second nonvolatile memory devices M1 and M2 share the channel CH, the first nonvolatile memory device M1 which has first received the read command may first output data, and accordingly, the first read request RQ1 may be first processed.

Next, referring to FIG. 3B, when processing of the first read request RQ1 is completed, the first read request RQ1 may be removed from the first queue Q1. Also, if the data read in response to the first read request RQ1 is completely transmitted to the host device, the buffer manager BM may deallocate the clusters C1.

Then, the core CORE may request the buffer manager BM to allocate clusters for the third read request RQ3. The third read request RQ3 for which cluster allocation is requested may be selected according to the order. If ordered read requests additionally exist in succession to the third read request RQ3, the third read request RQ3 may be preferentially selected according to the order.

As the clusters C1 are deallocated, since a currently unused size of the buffer BUF is sufficient to process the third read request RQ3, the clusters C1 may be allocated for the third read request RQ3 through the buffer manager BM. After the clusters C1 are allocated for the third read request RQ3, the core CORE may instruct the access unit ACU to process the third read request RQ3.

The access unit ACU may queue the third read request RQ3 into the third queue Q3 according to control of the core CORE. The third read request RQ3 queued into the third queue Q3 may be processed depending on the state of the third nonvolatile memory device M3 and the state of the channel CH.

In the meantime, the second read request RQ2 may be in process. That is to say, the data read from the second nonvolatile memory device M2 in response to the second read request RQ2 may be transmitted to the clusters C2 and may then be transmitted to the host device according to the order.

While the second read request RQ2 is processed, when the third nonvolatile memory device M3 is in an idle state and the channel CH is currently not occupied by any nonvolatile memory device, a read command corresponding to the third read request RQ3 may be transmitted to the third nonvolatile memory device M3, and the third read request RQ3 may be processed. Namely, the data read from the third nonvolatile memory device M3 in response to the third read request RQ3 may be transmitted to the clusters C1 and may then be transmitted to the host device according to the order.

Summarizing these operations, in the present embodiment, by reducing the size of the buffer BUF to the allowed size in response to in-order read requests, it is possible to process the in-order read requests while retaining the order thereof. Accordingly, the read speed of the memory system 100 may be improved.

Figure 4:
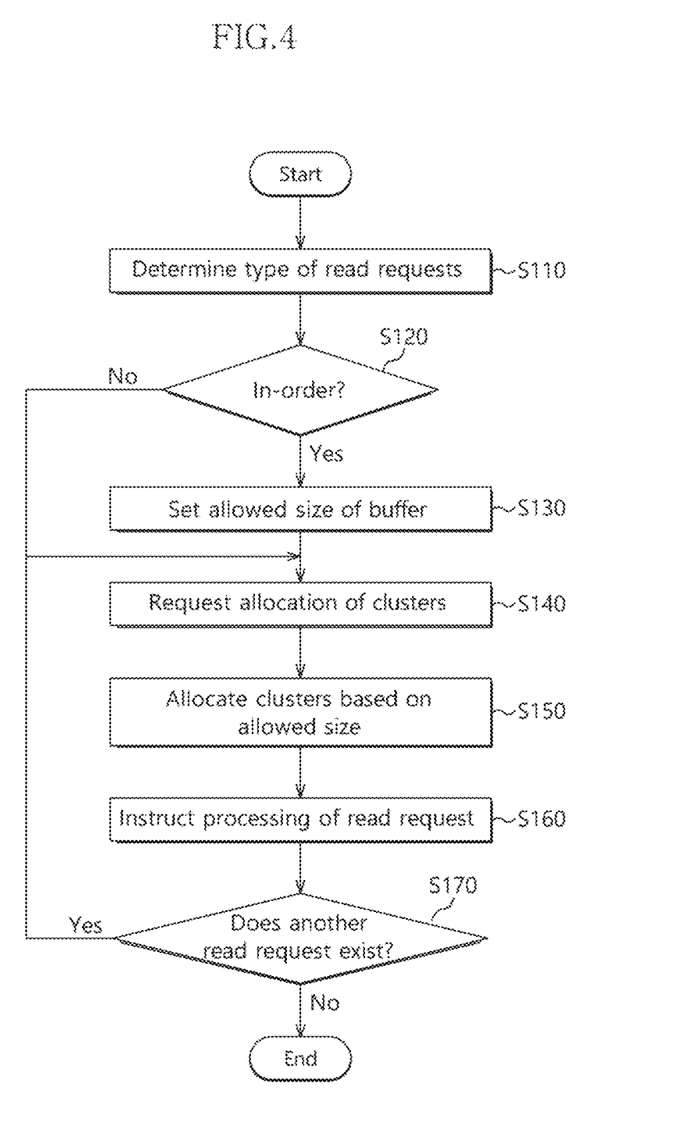
FIG. 4 is a flow chart explaining a method for operating a memory system in accordance with an embodiment.

FIG. 4 is a flow chart describing a method for operating the memory system 100 in accordance with an embodiment. FIG. 4 shows an operation method in the case where the core CORE receives a plurality of read requests from the host device.

Referring to FIG. 4, at step S110, the core CORE may determine the type of the read requests transmitted from the host device.

At step S120, when it is determined that the read requests are in-order read requests (that is, "Yes" at step S120), the process may proceed to step S130. Conversely, when it is determined that the read requests are out-of-order read requests (that is, "No" at step S120), the process may proceed to step S140.

At the step S130, the core CORE may set the allowed size of the buffer BUF. For example, the core CORE may set the size of the buffer BUF to the allowed size, which may be as much as two times the maximum data size capable of being transmitted to the buffer BUF through a single read operation of a nonvolatile memory device. The set allowed size of the buffer BUF is associated with the channel CH through which the in-order read requests are to be processed.

At the step S140, the core CORE may request the buffer manager BM to allocate clusters for processing a selected read request among the read requests according to an order of the read requests.

At step S150, the buffer manager BM may allocate clusters within the allowed size of the buffer BUF. In detail, the buffer manager BM may allocate clusters of a required size for the read request when the difference between the allowed size of the buffer BUF and a currently allocated size is greater than or equal to the required size for the read request.

When the allowed size of the buffer BUF has not been set, the buffer manager BM may immediately allocate clusters.

At step S160, the core CORE may instruct the access unit ACU to process the selected read request. The access unit ACU may process the selected read request through a corresponding nonvolatile memory device, in response to the instruction. The access unit ACU may control the first to fourth nonvolatile memory devices M1 to M4 to individually process the read requests according to the statuses of the first to fourth nonvolatile memory devices M1 to M4 and the channel CH despite the order of the read requests. However, when the allowed size of the buffer BUF is set due to the in-order read requests as described above, the access unit ACU may process the in-order read requests according to the order of the in-order read requests in the end.

When processing of the selected read request is completed and the data read in response to the selected read request is completely transmitted to the host device, the buffer manager BM may deallocate the clusters allocated for the selected read request.

At step S170, the core CORE may determine whether a read request to be allocated with clusters further exists or not. When a read request further exists, the process may proceed to the step S140. When a read request does not further exist, the process may be ended.

Figure 5:
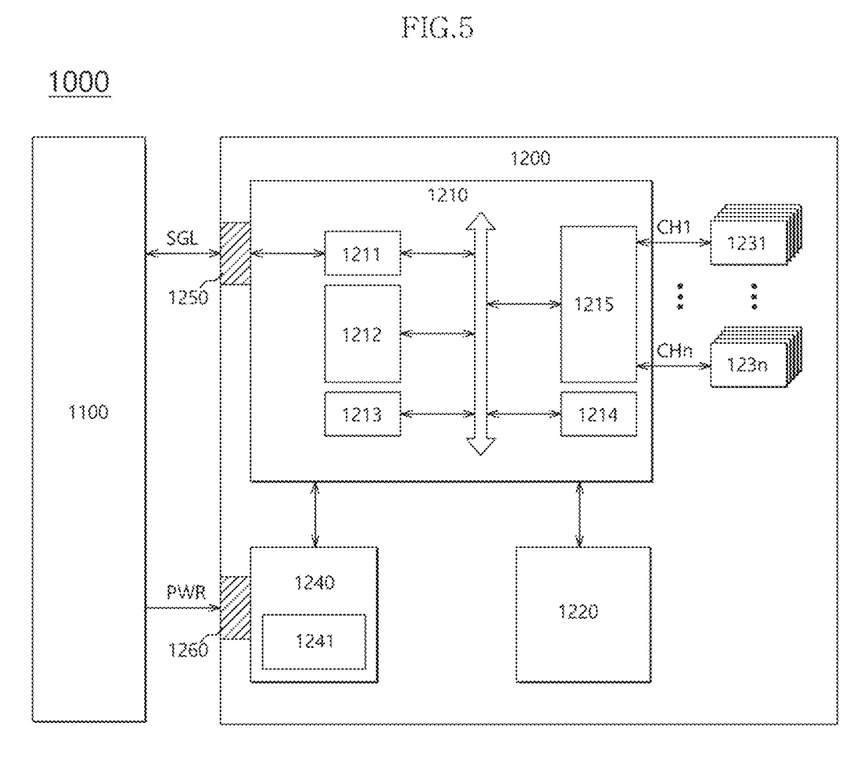
FIG. 5 is a diagram illustrating a data processing system including a solid state drive (SSD) in accordance with an embodiment.

FIG. 5 is a diagram illustrating a data processing system 1000 including a solid state drive (SSD) 1200 in accordance with an embodiment. Referring to FIG. 5, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface 1211, a control component 1212, a random access memory 1213, an error correction code (ECC) component 1214, and a memory interface 1215.

The host interface 1211 may exchange a signal SGL with the host device 1100 through the signal connector 1250. The signal SGL may include a command, an address, data, and so forth. The host interface 1211 may interface the host device 1100 and the SSD 1200 according to the protocol of the host device 1100. For example, the host interface 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (DATA), serial advanced technology attachment (SATA), small computer system interface (SCSI), serial attached SCSI (SAS), peripheral component interconnection (PCI), PCI express (PCI-E) and universal flash storage (UFS).

The control component 1212 may analyze and process the signal SGL received from the host device 1100. The control component 1212 may control operations of internal function blocks according to a firmware or a software for driving the SSD 1200. The random access memory 1213 may be used as a working memory for driving such a firmware or software.

The ECC component 1214 may generate the parity data of data to be transmitted to at least one of the nonvolatile memory devices 1231 to 123n. The generated parity data may be stored together with the data in the nonvolatile memory devices 1231 to 123n. The ECC component 1214 may detect an error of the data read from at least one of the nonvolatile memory devices 1231 to 123n, based on the parity data. If a detected error is within a correctable range, the ECC component 1214 may correct the detected error.

The memory interface 1215 may provide control signals such as commands and addresses to at least one of the nonvolatile memory devices 1231 to 123n, according to control of the control component 1212. Moreover, the memory interface 1215 may exchange data with at least one of the nonvolatile memory devices 1231 to 123n, according to control of the control component 1212. For example, the memory interface 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 6:
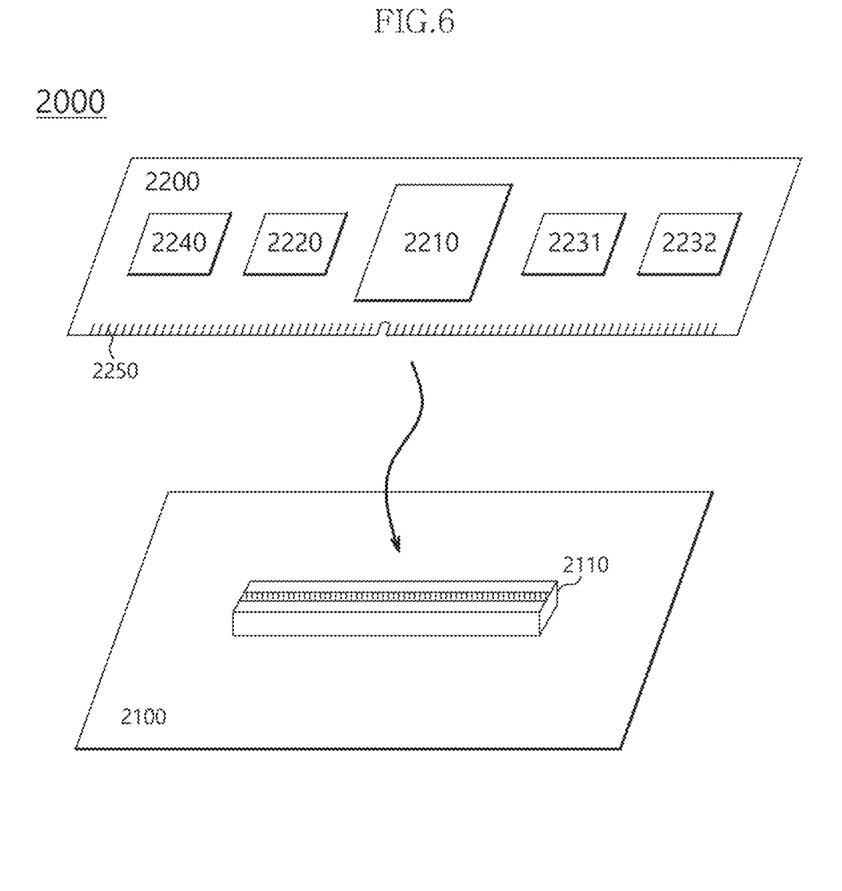
FIG. 6 is a diagram illustrating a data processing system including a memory system in accordance with an embodiment.

FIG. 6 is a diagram illustrating a data processing system 2000 including a memory system 2200 in accordance with an embodiment. Referring to FIG. 6, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 5.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 7:
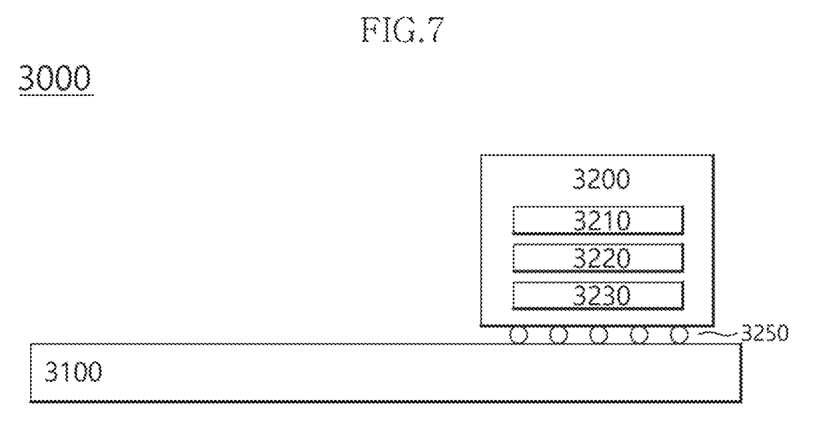
FIG. 7 is a diagram illustrating a data processing system including a memory system in accordance with an embodiment.

FIG. 7 is a diagram illustrating a data processing system 3000 including a memory system 3200 in accordance with an embodiment. Referring to FIG. 7, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 5.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 8:
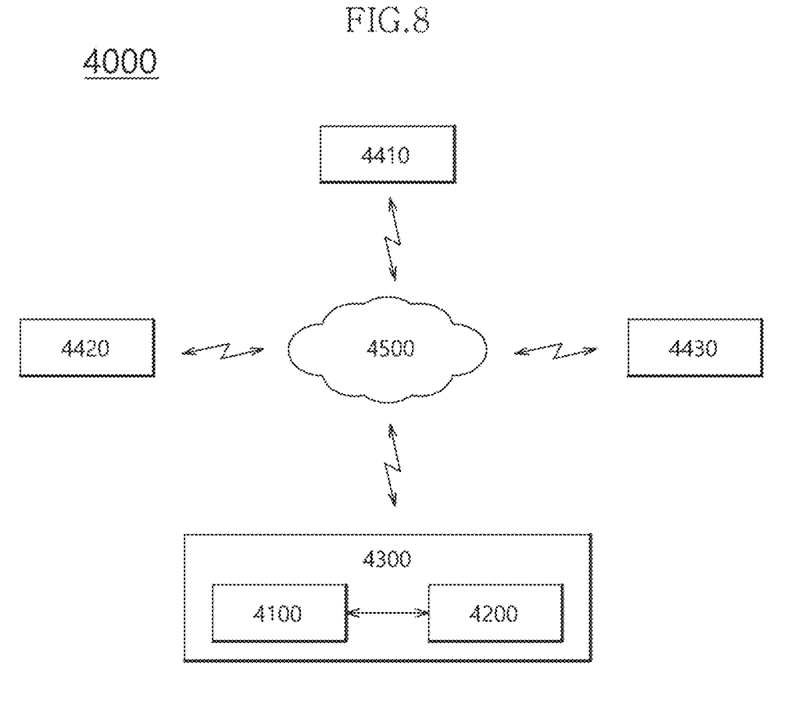
FIG. 8 is a diagram illustrating a network system including a memory system in accordance with an embodiment.

FIG. 8 is a diagram illustrating a network system 4000 including a memory system 4200 in accordance with an embodiment. Referring to FIG. 8, the network system 4000 may include a server system 4300 and a plurality of client systems 4410, 4420 and 4430 4430, which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured as the memory system 100 shown in FIG. 1, the memory system 1200 shown in FIG. 5, the memory system 2200 shown in FIG. 6, or the memory system 3200 shown in FIG. 7.

Figure 9:
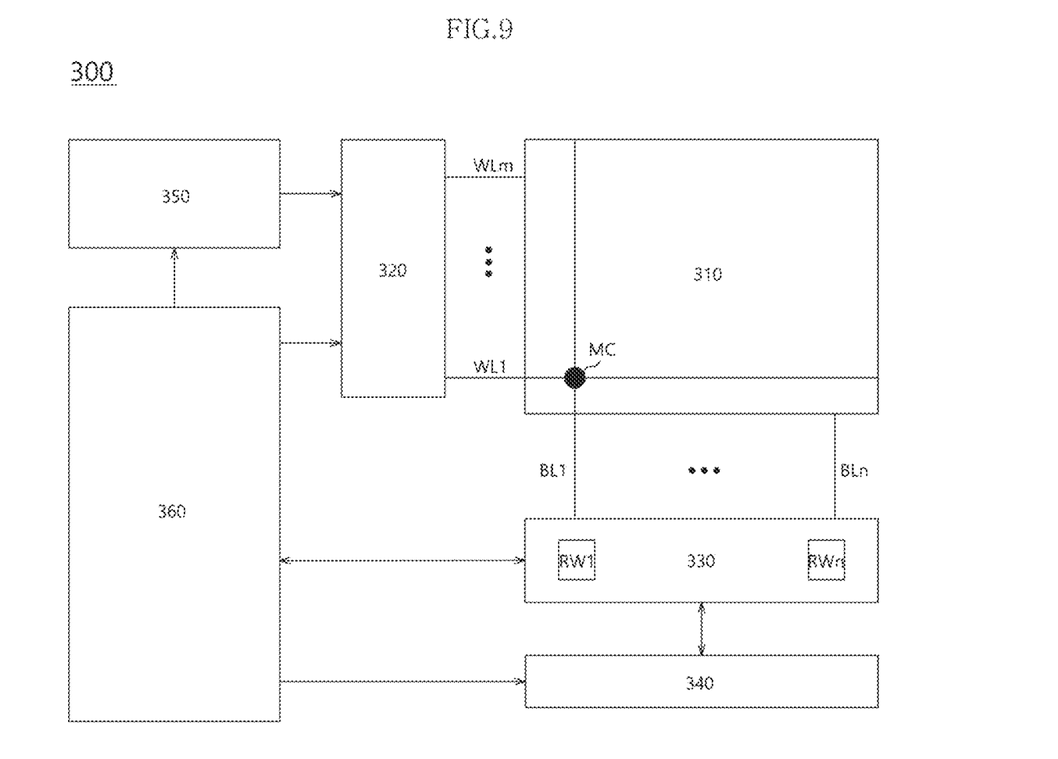
FIG. 9 is a block diagram illustrating a nonvolatile memory device included in a memory system in accordance with an embodiment.

FIG. 9 is a block diagram illustrating a nonvolatile memory device 300 included in a memory system in accordance with an embodiment. Referring to FIG. 9, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read write and erase operations of the nonvolatile memory device 300.

While various embodiments have been described above, it will be understood to those skilled in the art that the embodiments described are examples only. Accordingly, the memory system and the operating method thereof described herein should not be limited based on the described embodiments.

What is claimed is:

1. A memory system comprising:
   a plurality of nonvolatile memory devices sharing a communication line; and
   a controller including a buffer and a core, the controller suitable for controlling the plurality of nonvolatile memory devices through the communication line,
   wherein the core determines a type of a plurality of read requests for the plurality of nonvolatile memory devices, and sets an allowed size of the buffer based on the determined type.

2. The memory system according to claim 1, wherein the core sets the allowed size when the type is determined to be in-order.

3. The memory system according to claim 1, wherein the core sets the allowed size to two times a maximum data size capable of being transmitted to the buffer through a single read operation of one of the plurality of nonvolatile memory devices.

4. The memory system according to claim 1,
   wherein the controller further includes a buffer manager and an access unit,
   wherein the core requests allocation of clusters to the buffer manager for processing of a read request selected according to an order of the plurality of read requests, and instructs the access unit to process the selected read request after the clusters are allocated, and
   wherein the buffer manager allocates the clusters based on the allowed size.

5. The memory system according to claim 4, wherein, when a difference between the allowed size and a currently allocated size is greater than or equal to a required size of the read request, the buffer manager allocates clusters of the required size.

6. The memory system according to claim 4, wherein the access unit includes a plurality of queues which correspond to the nonvolatile memory devices, respectively, and queues the selected read request into a queue corresponding to a nonvolatile memory device, among the plurality of nonvolatile memory devices, to which the selected read request is to be transmitted.

7. The memory system according to claim 4, wherein the access unit processes, out of order, read requests, among the plurality of read requests, queued into the plurality of queues, for the plurality of nonvolatile memory devices.

8. The memory system according to claim 4, wherein the buffer manager deallocates the clusters when processing of the selected read request is completed.

9. A method for operating a memory system, comprising:
   determining a type of a plurality of read requests for a plurality of nonvolatile memory devices, using a controller; and
   setting an allowed size of a buffer of the controller based on the determined type, using the controller.

10. The method according to claim 9, wherein the setting of the allowed size comprises:
setting the allowed size when the type is determined to be in-order.

11. The method according to claim 9, wherein the setting of the allowed size comprises:
setting the allowed size to two times a maximum data size capable of being transmitted to the buffer through a single read operation of one of the plurality of nonvolatile memory devices.

12. The method according to claim 9, further comprising:
requesting allocation of clusters to a buffer manager of the controller for processing of a read request selected according to an order of the plurality of read requests, using the controller;
allocating the clusters based on the allowed size, using the buffer manager; and
instructing an access unit of the controller to process the selected read request after the clusters are allocated.

13. The method according to claim 12, wherein the allocating of the clusters comprises:
allocating, when a difference between the allowed size and a currently allocated size is greater than or equal to a required size of the read request, clusters of the required size.

14. The method according to claim 12, further comprising:
queueing the selected read request into a corresponding queue among a plurality of queues, using the access unit; and
transmitting a command corresponding to the read request to a nonvolatile memory device corresponding to the queue, using the access unit.

15. The method according to claim 12, further comprising:
deallocating the clusters when processing of the read request is completed, using the buffer manager.

16. The method according to claim 9, wherein the plurality of nonvolatile memory devices share a communication line.

17. A method for operating a memory system, comprising:
adjusting an allowed size of a buffer, using a controller that includes the buffer;
requesting allocation of clusters for each of a plurality of read requests, using a controller;
allocating the clusters based on an unused size of the buffer calculated based on the allowed size, using the controller; and
processing a selected read request, among the plurality of read requests, for which the clusters are allocated, using the controller.

18. The method according to claim 17, wherein the adjusting of the allowed size comprises:
adjusting the allowed size when the plurality of read requests are in-order read requests.

19. The method according to claim 18, wherein the adjusting of the allowed size comprises:
setting the allowed size to two times a maximum data size capable of being transmitted to the buffer through a single read operation of a nonvolatile memory device.

* * * * *